United States Patent [19]

Leonard et al.

[11] Patent Number: 5,345,166
[45] Date of Patent: Sep. 6, 1994

[54] REGULATED VOLTAGE TWO-WIRE DETECTOR

[75] Inventors: Didier Leonard, Hiersac; Pierre Charrier, Chardonchamps, both of France

[73] Assignee: Telemecanioue, France

[21] Appl. No.: 861,853

[22] PCT Filed: Oct. 17, 1991

[86] PCT No.: PCT/FR91/00814

§ 371 Date: Jun. 18, 1992

§ 102(e) Date: Jun. 18, 1992

[87] PCT Pub. No.: WO92/07426

PCT Pub. Date: Apr. 30, 1992

[30] Foreign Application Priority Data

Oct. 18, 1990 [FR] France .................. 90 12883

[51] Int. Cl.$^5$ .................. G05F 3/16; H03K 17/30
[52] U.S. Cl. .................. 323/324; 307/116; 307/117; 361/179; 361/180
[58] Field of Search .......... 323/324, 325, 326, 222, 323/224; 307/116, 117; 361/179, 180

[56] References Cited

U.S. PATENT DOCUMENTS

| | | |
|---|---|---|
| 4,138,709 | 2/1979 | Colwill . |
| 4,168,443 | 9/1979 | Periot . |
| 4,641,132 | 2/1987 | Reger . |
| 4,672,230 | 6/1987 | Spähn . |
| 4,920,281 | 4/1990 | Harris . |
| 4,924,122 | 5/1990 | Harris . |
| 5,034,621 | 7/1991 | Groves et al. . |
| 5,068,592 | 11/1991 | Leonard . |

*Primary Examiner*—Emanuel T. Voeltz
*Attorney, Agent, or Firm*—William A. Drucker

[57] ABSTRACT

Detector comprising a sensor and a processing circuit connected to a load by means of two wires. Two switches (I1, I2) are arranged in series in a switching circuit leg (21), the ends of which (C, D) are connected to the detector terminals and the middle point (S) to a terminal (F) of the processing circuit. When operating (I1) is conductive and (I2) determines a parallel regulation of the voltage (V) at the processing circuit (12) terminals ; when in rest position, (I1) determines a series regulation of the voltage while (I2) is blocked.

6 Claims, 1 Drawing Sheet

REGULATED VOLTAGE TWO-WIRE DETECTOR

The present invention concerns a detector comprising a sensor associated with an electronic processor circuit and a voltage regulator and switching device for switching a load under the control of the output of the processor circuit, a power supply being connected in series with the load to supply power thereto and to the detector.

Detectors of this kind are known as "two-wire" detectors because they are connected to the load and to the supply by only two conductors so that they are supplied with power in series with the load. Examples include proximity or like detectors generating an oscillation whose magnitude to be detected modifies the characteristics.

To improve the performance of a detector of this kind attempts are made to minimise the residual current that it draws when it is not carrying the load current ("off" state) and the voltage drop that it generates when it carries the load current ("on" state). It is also beneficial to regulate the voltage supplied to the sensor by the supply in the on and off states and in particular during transient phases during which the detector changes from the on state to the off state or vice versa.

A particular object of the invention is to ensure in a detector of this type satisfactory regulation of the voltage supplied to the processor circuit in the various operating states using simple electronic means.

Another object of the invention is to reduce the power dissipation of said electronic means and, in some cases, to enable them to protect the detector against overcurrents.

To achieve these results, the invention proposes a detector comprising a sensor associated with an electronic processor circuit and a voltage regulator and switching device adapted to be connected via two terminals of the detector to a load circuit comprising a load in series with a voltage source, the device being controlled by the processor circuit to open and close the load circuit according to the state of the sensor and also regulating the supply voltage of the processor circuit, the regulator and switching device comprising two switching devices associated with respectively series and parallel regulator means, the two switching means:
  being disposed in a switching branch whose ends are connected to terminals of the detector and of which one end and an intermediate point are connected to terminals of the processor circuit, and
  being such that, in a first state of the sensor, the switching device activates the parallel type regulator means regulating the voltage across the processor circuit and, in a second state of the sensor, the switching device activates the series type regulator means regulating the voltage across the processor circuit and disables the parallel type regulator means.

According to the invention, this device is characterised in that the switching means comprise two variable gain amplifier-switches in series, one amplifier-switch additionally providing the series regulator function and the other amplifier-switch additionally providing the parallel type regulator function.

In the on state, which represents the first state of the sensor, the amplifier-switch which operates as a parallel regulator carries the same current as the amplifier-switch providing series type regulation. The latter is chosen and adapted so that its voltage drop is as small as possible.

The amplifier-switch providing series regulation preferably comprises an insulated gate transistor. This transistor provides series regulation in the second state of the sensor by virtue of the connection of its gate to a threshold device such as a Zener diode biased by a resistor connected to the supply voltage. In the first state of the sensor the first switch is caused to conduct either by turning on the insulated gate transistor using appropriate means or by turning on a thyristor shunting said transistor.

The amplifier-switch providing parallel regulation is advantageously of the bipolar type whose control terminal (base) is controlled by the output of a differential amplifier comparing a fraction of the voltage across the processor circuit with a reference voltage.

A non-limiting example of one embodiment of the invention will now be described with reference to the appended drawing in order to explain the invention.

Figure 1:
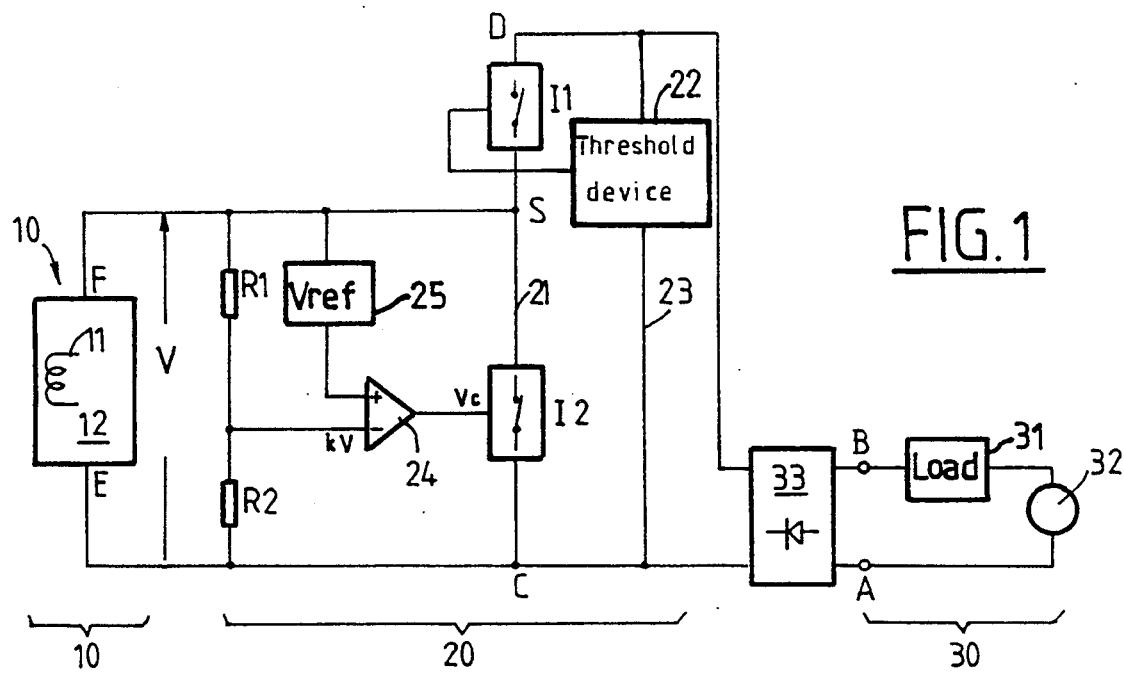
FIG. 1 is a block diagram of a proximity detector in accordance with the invention.

The proximity detector shown in FIG. 1 comprises a sensor system 10 comprising a sensor element 11 associated with an electronic processor circuit 12. The sensor element 11 is adapted to detect the variation of a presence or a magnitude. Depending on this variation, the circuit 12 assumes two states represented by the high or low level of a voltage V. The detector further comprises a voltage regulator and switching device 20 which starts and stops a load according to the voltage V across the circuit 12.

The switching device 20 is adapted to be connected via two terminals A and B of the detector to a load circuit 30 comprising a load 31 in series with a voltage source 32. The device 20 is connected to the load and to the supply by two conductors, the supply feeding the load and the detector. The voltage source is a DC voltage source or an AC voltage source, a rectifier 33 being provided in the latter case at the input of the detector; the switching device 20 has two functions, one of which is to switch the load 31 and the other of which is to provide an interface between the sensor system 10 and the load circuit 30, regulate the voltage supplied by the voltage source and deliver at terminals E, F of the circuit 12 a regulated voltage irrespective of the status of the latter circuit.

When the detector opens the load circuit 30 the residual current drawn by its electronic circuits must be as low as possible; likewise, when the detector closes the load circuit the voltage drop that it generates and which energises its electronic circuits must be as small as possible.

The supply voltage at terminals E, F of the circuit 12 is regulated by a first switch I1 when the detector is idle and the load is off and by a second switch I2 carrying the load current when the detector is active and the load is on. The switches I1, I2 are disposed in series in a switching branch 21 of the device 20. The respective ends C, D of the branch 21 are connected to the terminals A, B of the detector. The end C and an intermediate point S of the branch are connected to the terminals E, F of the processor circuit 12.

Figure 2:
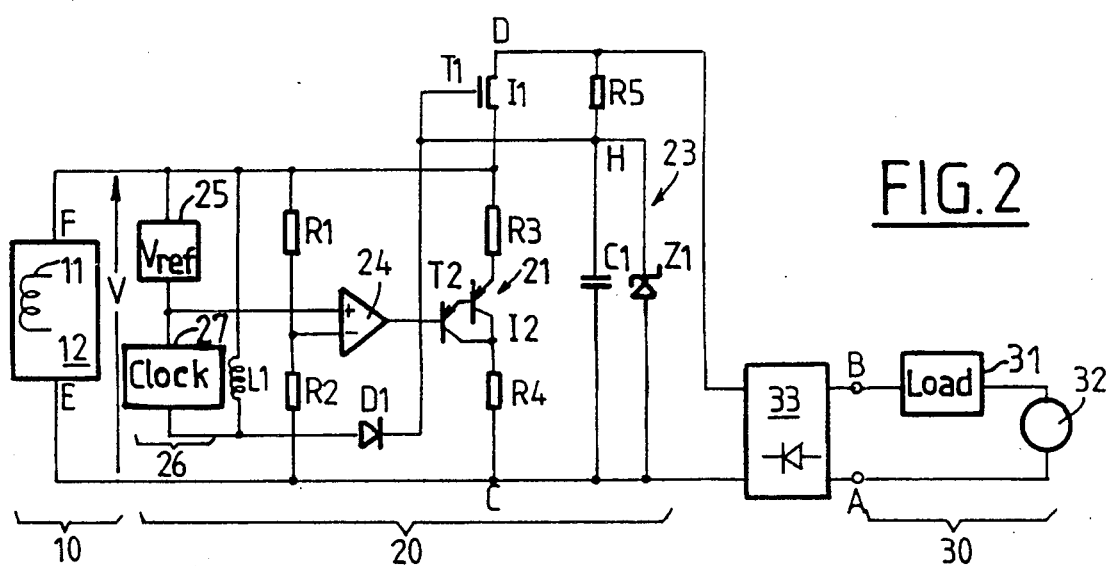
FIG. 2 is a more detailed block diagram of a first embodiment of a proximity detector in accordance with the invention.

FIG. 2 shows in more detail the circuitry of a first embodiment of the proximity detector in accordance with the invention. The sensor 11 of this detector generates an oscillation which is damped to a greater or lesser degree depending on the distance to an object to be detected, this damping being converted into a signal of voltage V by the processor circuit.

A control terminal of the first switch I1 is connected to a threshold device 22, a Zener diode or like component, for example, in a branch 23 parallel to the branch 21.

The second switch I2 is controlled by a feedback loop comprising a differential amplifier 24. A precise and stable voltage Vref produced by a generator 25 of the band-gap type, for example, is applied to the non-inverting input of the amplifier 24; a fraction of the voltage V is applied to the inverting input of the amplifier 24 by a divider bridge R1, R2 so that the switch I2 is controlled by the error signal Vc. The switch I2 thus regulates the voltage at the point S of the branch 21 between I1 and I2.

In the embodiment shown in FIG. 2 the switch I1 comprises an insulated gate transistor T1. This is an MOS transistor whose drain is connected to the end D of the branch 21 and whose source is connected to the point S. The gate of T1 is connected to a mid-point H of the branch 23 between a resistor R5 and a Zener diode Z1 in parallel with a capacitor C1 and via a diode D1 to a voltage multiplier circuit 26. The voltage multiplier circuit 26 includes a pulse generator or clock 27 connected to the reference voltage generator 25 and an inductor L1 connected between the point S and the anode of D1.

The switch I1 comprises a bipolar Darlington circuit T2 whose main emitter is connected to the point S via a resistor R3 and whose collector is connected to the point C via a resistor R4. The control input (base) of T2 is connected to the output of the amplifier 24. A single bipolar transistor or an insulated gate transistor may be substituted for the Darlington device.

The FIG. 2 detector operates in the following manner. When the sensor determines that the load 31 is on the clock 27 associated with the inductor L1 applies to the gate of the transistor T1 a high voltage (a voltage in the order of 12 V, for example) which turns it on. The inductor L1 also generates a voltage surge on opening and injects a current into C1, Z1. The load circuit 30 is closed by the conducting switching branch 21. The Darlington transistor T2 maintains a constant potential at the source of the transistor T1 by virtue of the control loop including the amplifier 24.

If an overcurrent occurs either because of a low load 31 or because of a short-circuit the high current in the switching branch 21 increases the voltage drop across R3, R4 which is added to the collector-emitter voltage of T2 to serve a limiter function. The voltage drop in R3 is detected by the feedback loop which after a time interval of 100 μs for a short-circuit or 20 ms for an overload, for example, turns off the switch T2.

When the sensor determines that the load 31 is off the amplifier 24 is not biased and turns off the Darlington circuit T2. The voltage multiplier circuit 26 is not activated and the transistor T1 is turned on with a gate voltage regulated by the network R5-Z1 to 12 V, for example, from the potential at the point D to produce a regulated voltage V of 8 V, for example.

Figure 3:
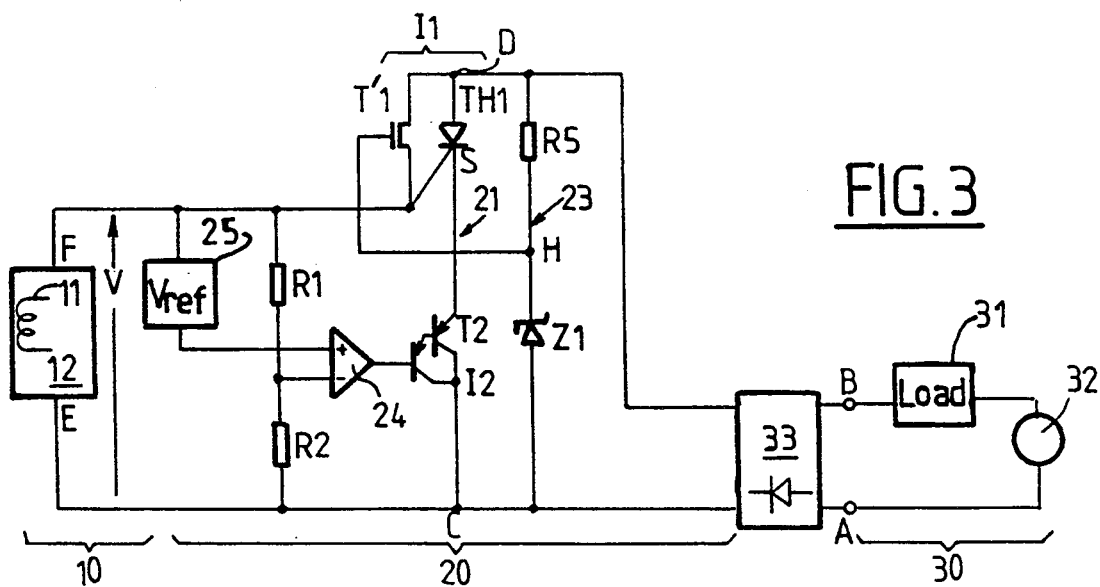
FIG. 3 is the block diagram of a second embodiment of a detector in accordance with the invention.

In the unprotected embodiment shown in FIG. 3 the switch I1 comprises a thyristor TH1 in a branch 21 which is turned on in the on state and turned off in the off state and an MOS transistor T'1 shunting the thyristor in the off state and turned off in the on state.

As previously, the switch I2 comprises a bipolar Darlington circuit T2. The transistor T'1 is in parallel with the anode-gate path of the thyristor TH1 the anode of which is connected to the point D and the cathode of which is connected to the emitter of T2. The gate of the thyristor, forming the point S mentioned above, is connected to the terminal F of the processor circuit 12. The gate of the transistor T'1 is connected to the point H of the branch 23.

The FIG. 3 detector operates in the following manner. When the sensor turns on the load 31 the thyristor TH1 is turned on and the transistor T'1 is turned off. The processor circuit 12 is energised via the anode-gate path of the thyristor. The voltage V across the circuit 12 is regulated by the Darlington circuit T2 on the basis of the comparison carried out by the amplifier 24 between the reference voltage reference Vref and the fraction of the voltage V determined by the divider bridge R1, R2. The Darlington circuit T2 regulates the cathode voltage of TH1. The voltage drop of the branch 21 remains low.

When the sensor turns off the load 31 the transistor T2 is turned off which turns off the thyristor TH1 and turns on the transistor T'1. The required series regulation is then provided by the bias at the gate of T'1 (R5, Z1).

The invention can be applied to detectors of all types.

We claim:

1. A regulated voltage two-wire detector comprising:
   a load circuit comprising a load in series with a voltage source and two terminals;
   a voltage regulator and switching device comprising a first and a second variable gain amplifier-switch connected in series in a switching branch having a junction point and two ends which are respectively connected to the two terminals of the load circuit, said first amplifier-switch having a first state in which it is turned off and a second state in which it provides a parallel type voltage regulation, and said second amplifier-switch having a first state in which it is turned on and a second state in which it provides a series type voltage regulation;
   a sensor associated with an electronic processor circuit having two terminals respectively connected to one of said two ends and to said junction point of said switching branch, and supplied with a regulated voltage by said voltage regulator and switching device, said electronic processor circuit controlling said first and second variable gain amplifier-switches so that:
   when the sensor is in a first state said first amplifier-switch is in its second state and said second amplifier-switch is in its first state, and
   when said sensor is in a second state said first amplifier-switch is in its first state and said second amplifier-switch is in its second state; and
   means for keeping said second amplifier-switch in its second state when said sensor is in its first state.

2. The detector according to claim 1, wherein the first amplifier-switch providing the parallel type regulator function has a control terminal controlled by the output of a differential amplifier comparing part of the regulated voltage supplied to the processor circuit with a reference voltage.

3. The detector according to claim 1, wherein the second amplifier-switch providing the series type regulator function is an insulated gate transistor.

4. The detector according to claim 1, wherein at least one resistor is included in the switching branch to contribute with the amplifier-switches and their control means to limiting overcurrents in the switching branch.

5. A regulated voltage two-wire detector comprising:
a load circuit comprising a load in series with a voltage source and two terminals;
a voltage regulator and switching device comprising a variable gain amplifier-switch and an insulated gate transistor connected in series in a switching branch having a junction point and two ends which are respectively connected to the two terminals of the load circuit, said amplifier-switch having a first state in which it is turned off and a second state in which it provides a parallel type voltage regulation, and said transistor having a first state in which it is turned on and a second state in which it provides a series type voltage regulation;
a sensor associated with an electronic processor circuit having two terminals respectively connected to one of said two ends and to said junction point of said switching branch, and supplied with a regulated voltage by said load circuit through said voltage regulator and switching device, said electronic processor circuit controlling said variable gain amplifier-switches so that:
when the sensor is in a first state said amplifier-switch is in its second state and said transistor is in its first state, and
when said sensor is in a second state said amplifier-switch is in its first state and said transistor is in its second state;

a voltage multiplier circuit connected to a gate of said transistor, which keeps said transistor saturated in said first state; and
a voltage threshold network connected to the gate of said transistor, which regulates voltage applied to said gate in said first state.

6. A regulated voltage two-wire detector comprising:
a load circuit comprising a load in series with a voltage source and two terminals;
a switching and parallel type voltage regulator element and a switching and series type regulator voltage element which comprises a thyristor having an anode and a gate, and an insulated gate transistor connected between said anode and said gate, said thyristor being connected in series with said switching and parallel type voltage regulator element in a switching branch having two ends which are respectively connected to the two terminals of the load circuit, said transistor having a gate which is connected to a voltage threshold network; and
a sensor associated with an electronic processor circuit having two terminals respectively connected to one of said two ends and to the gate of said thyristor, and supplied with a regulated voltage by said load circuit through said switching and voltage regulator elements, said electronic processor circuit controlling said switching and voltage regulator elements so that:
when said sensor is in a first state, said thyristor and said switching and parallel type voltage regulator element are turned on and said transistor is turned off, and
when said sensor is in a second state, said transistor providing a series type regulator function is turned on and said thyristor and said switching and parallel type voltage regulator element are turned off.

* * * * *